(12) United States Patent
Chuang et al.

(10) Patent No.: US 11,854,972 B2
(45) Date of Patent: Dec. 26, 2023

(54) MEMORY DEVICE

(71) Applicant: Winbond Electronics Corp., Taichung (TW)

(72) Inventors: Chia-Jung Chuang, Taichung (TW); Isao Tanaka, Taichung (TW); Yung-Wen Hung, Taichung (TW); Chao-Yi Huang, Taichung (TW)

(73) Assignee: Winbond Electronics Corp., Taichung (TW)

(*) Notice: Subject to any disclaimer, the term of this patent is extended or adjusted under 35 U.S.C. 154(b) by 276 days.

(21) Appl. No.: 17/380,033

(22) Filed: Jul. 20, 2021

(65) Prior Publication Data

US 2021/0351131 A1  Nov. 11, 2021

Related U.S. Application Data

(62) Division of application No. 16/571,196, filed on Sep. 16, 2019, now Pat. No. 11,114,380.

(51) Int. Cl.
  *H01L 23/528* (2006.01)
  *H01L 23/522* (2006.01)
  (Continued)

(52) U.S. Cl.
  CPC ........ *H01L 23/5283* (2013.01); *G03F 7/7015* (2013.01); *H01L 21/76224* (2013.01); *H01L 23/5226* (2013.01); *H01L 28/60* (2013.01); *H10B 12/053* (2023.02); *H10B 12/31* (2023.02); *H10B 12/34* (2023.02); *H10B 12/482* (2023.02); *H10B 12/485* (2023.02); *H10B 12/488* (2023.02)

(58) Field of Classification Search
  CPC ... H10B 12/485; H10B 12/482; H10B 12/488
  See application file for complete search history.

(56) References Cited

U.S. PATENT DOCUMENTS

| 2018/0335703 A1* | 11/2018 | Wang | G06F 30/392 |
| 2019/0206877 A1* | 7/2019 | Kim | H10B 12/488 |

FOREIGN PATENT DOCUMENTS

| CN | 105448919 | 3/2016 |
| CN | 108695325 | 10/2018 |

OTHER PUBLICATIONS

"Office Action of China Counterpart Application", dated Apr. 21, 2023, p. 1-p. 7.

* cited by examiner

*Primary Examiner* — Jay C Chang
*Assistant Examiner* — Mikka Liu
(74) *Attorney, Agent, or Firm* — JCIPRNET

(57) ABSTRACT

A memory device includes a word line, a bit line, an active region and a bit line contact structure. The word line is disposed in the substrate, and extends along a first direction. The bit line is disposed over the substrate, and extends along a second direction. The active region is disposed in the substrate, and extends along a third direction. The bit line contact structure is disposed between the active region and the bit line. A top view pattern of the bit line contact structure has a long axis. An angle between the extending direction of this long axis and the third direction is less than an angle between the extending direction of this long axis and the first direction, and is less than an angle between the extending direction of this long axis and the second direction.

18 Claims, 6 Drawing Sheets

(51) Int. Cl.
*G03F 7/00* (2006.01)
*H01L 21/762* (2006.01)
*H01L 49/02* (2006.01)
*H10B 12/00* (2023.01)

MEMORY DEVICE

CROSS-REFERENCE TO RELATED APPLICATION

This is a divisional application of U.S. patent application Ser. No. 16/571,196, filed on Sep. 16, 2019. The entirety of the above-mentioned patent application is hereby incorporated by reference herein and made a part of this specification.

BACKGROUND

Technical Field

The present invention relates to a memory device and a method of manufacturing the same, and more particularly to a dynamic random access memory (DRAM) device and a method of manufacturing the same.

Description of Related Art

With the development of the DRAM process, the bit line contact disposed between the substrate and the bit line is changed from a strip structure to a plurality of column structures. Based on the limitation of the lithography process, a portion of the active region is likely to remain around the column bit line contact. A parasitic capacitance may be formed between the residual portion of the active region and the bit line, and the residual portion of the active region may be in electrical contact with the adjacent capacitive contact so as to cause a short circuit problem. Therefore, the reliability of DRAM may be affected.

SUMMARY

The present invention provides a memory device and a method of manufacturing the same. This memory device may be a DRAM device and may have high reliability.

The memory device of the embodiment of the present invention includes a word line, a bit line, an active region, and a bit line contact structure. The word line is disposed in the substrate and extends along a first direction. The bit line is disposed over the substrate and extends along a second direction. The first direction is intersected with the second direction. The active region is disposed in the substrate, extends along a third direction and is intersected with the word line and the bit line. The third direction is different from the first direction and the second direction. The bit line contact structure is disposed between the active region and the bit line. The top view pattern of the bit line contact structure has a long axis. The angle between the extending direction of the long axis and the third direction is less than the angle between the extending direction of the long axis and the first direction, and is less than the angle between the extending direction of the long axis and the second direction.

A method of manufacturing a memory device according to some embodiments of the present invention includes the following steps of forming an active region, a word line, and an initial bit line contact structure in a substrate; and forming a bit line on the substrate and removing a portion of the initial bit line contact structure that is not overlapped with the bit line to form a bit line contact structure. The word line extends along a first direction. The bit line extends along a second direction intersected with the first direction. The active region is intersected with the word line and the bit line, and extends along a third direction different from the first direction and the second direction. The bit line contact structure is disposed between the active region and the bit line. The lithography process used to form the initial bit line contact structure includes the use of a free-form lens array to allow a light pass through the free-form lens array before the light is incident on the photomask. The free-form lens array includes a plurality of lenses. The lenses are arranged along a parallelogram-like contour. The parallelogram-like contour has a long axis. The angle between the extending direction of the long axis and the third direction is less than the angle between the extending direction of the long axis and the first direction, and is less than the angle between the extending direction of the long axis and the second direction.

Based on the above, the angle between the extending direction of the long axis of the initial bit line contact structure and the third direction is less than the angle between the extending direction of the long axis and the first direction, and is less than the angle between the extending direction of the long axis and the second direction, such that the long axis of the initial bit line contact structure disposed on the active region can be close to the extending direction of the active region (i.e., the third direction). In this way, the contour of the initial capacitive contact structure can be as close as possible to the edge of a portion of the active region on the side of the word line, and completely cover the portion of the active region. In other words, when the initial bit line contact structure is formed, the top of the active region can be completely removed, such that an issue that some portions of the active region remains around the subsequently formed capacitive contact structure can be avoided. A parasitic capacitance may be formed between such residual portions of the active region and the bit line, and such residual portions of the active region may cause a short circuit problem with the adjacent capacitive contact structure. Therefore, the bit line contact structure formed by the manufacturing method of the present invention can avoid the above problems of parasitic capacitance and short circuit, and thus the reliability of the memory device can be improved.

In order to make the aforementioned features and advantages of the disclosure more comprehensible, embodiments accompanied with figures are described in detail below.

DESCRIPTION OF THE EMBODIMENTS

Figure 1:
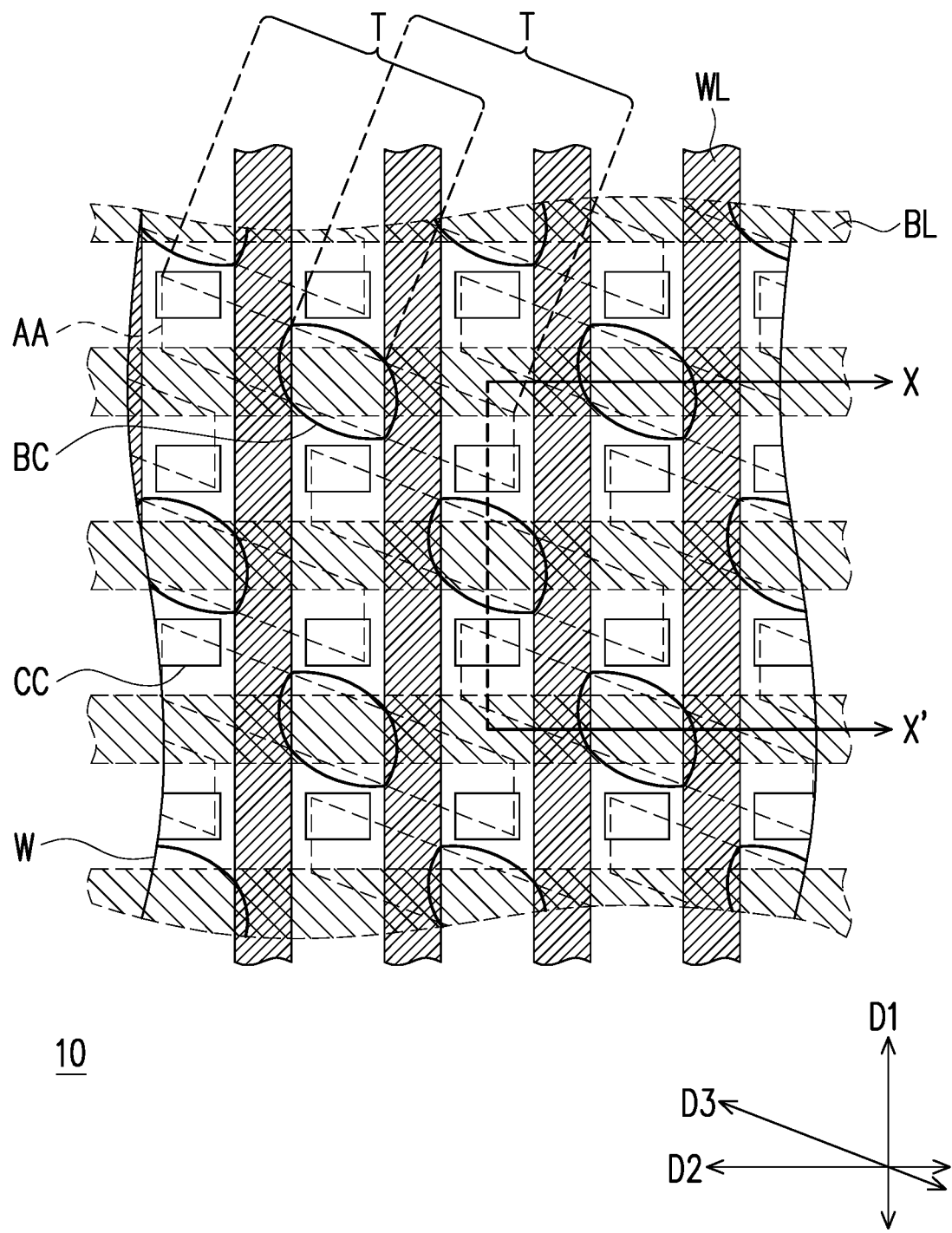
FIG. 1 is a schematic top view of an intermediate structure of a manufacturing process of a memory device according to some embodiments of the invention.

The bit line BL has not been formed in the structure shown in FIG. 1, and the position of the bit line BL is indicated only by the dotted outline. In addition, for the sake of brevity, the active region AA is also shown by a dotted line.

Referring to FIG. 1, a memory device 10 of some embodiments of the present invention includes a plurality of active regions AA. The active region AA may be a doped region disposed in the substrate W. The active regions AA may be separated from each other and may define the position of one or more transistors T, respectively. For example, as shown in FIG. 1, two transistors T are formed in the same active region AA. In addition, the memory device 10 further includes a plurality of word lines WL, a plurality of initial bit line contact structures BC, and a plurality of capacitive contact structures CC. Each active region AA is intersected with at least one word line WL and overlapped with at least one initial bit line contact structure BC and at least one capacitive contact structure CC. For example, as shown in FIG. 1, each active region AA is intersected with two word lines WL, and overlapped with one initial bit line contact structure BC and two capacitance contact structures CC. The gate (not shown) of the transistor T located in the active region AA is electrically connected to the word line WL, and the source and the drain (not shown) of the transistor T are electrically connected to the initial bit line contact structure BC and the capacitive contact structure CC. It can be seen that each word line WL is located between one initial bit line contact structure BC and one capacitive contact structure CC. In some embodiments, referring to FIG. 1, two transistors T located in the same active region AA may share the same source/drain and the same initial bit line contact structure BC electrically connected to the said source/drain. Each initial bit line contact structure BC is configured to electrically connect one of the source and the drain of the corresponding transistor T to one bit line BL (this has not yet formed, and the dotted line is used to show the position of the bit line BL), and each capacitive contact structure CC is configured to electrically connect the another one of the source and the drain of the corresponding transistor T to the storage capacitor (not shown). In some embodiments, the word line WL may be a buried word line and disposed in the substrate W, and the bit line BL and the storage capacitor (not shown) are disposed over the substrate W. Each transistor T and its corresponding storage capacitor (not shown) may serve as a memory cell of the DRAM integrated circuit, and the bit line BL and the word line WL may be configured to receive a voltage to drive the memory cells of the DRAM integrated circuit.

In some embodiments, the word lines WL extend along the first direction D1 and are arranged along the second direction D2, and the bit lines BL extend along the second direction D2 and are arranged along the first direction D1. The first direction D1 is intersected with the second direction D2. For example, the first direction D1 is substantially orthogonal to the second direction D2. In addition, the active regions AA extend along the third direction D3. The third direction D3 is intersected with the first direction D1 and the second direction D2. In some embodiments, the angle between the third direction D3 and the first direction D1 is 30° to 45°. In addition, the initial bit line contact structures BC may be arranged in an array along the first direction D1 and the second direction D2. Similarly, the capacitive contact structures CC may be arranged in an array along the first direction D1 and the second direction D2. Each initial bit line contact structure BC disposed along the second direction D2 may be overlapped with the one bit line BL, and each initial bit line contact structure BC may be located between two adjacent capacitive contact structures CC in the first direction D1. In some embodiments, as shown in FIG. 1, each of the capacitive contact structures CC is only partially overlapped with the active region AA below. In such embodiments, each of the capacitive contact structures CC is considered to be displaced toward the adjacent initial bit line contact structure BC, and the spacing between the capacitive contact structure CC and the initial bit line contact structure BC adjacent to each other can be shortened. In this way, the area of the memory cell of the DRAM integrated circuit can be reduced, and the storage density of the DRAM integrated circuit can be increased.

Figure 2:
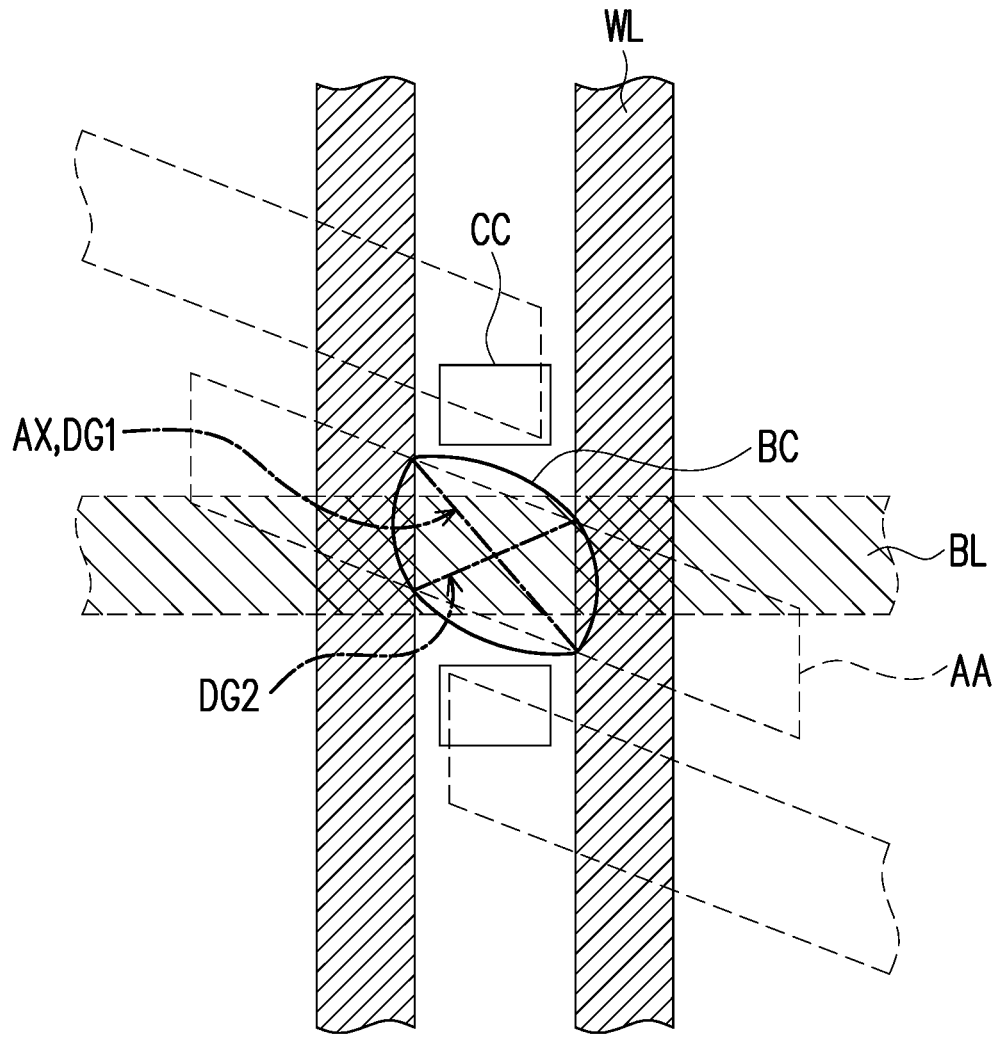
FIG. 2 is an enlarged schematic view of the initial bit line contact structure and surrounding elements of FIG. 1.
Figure 2:
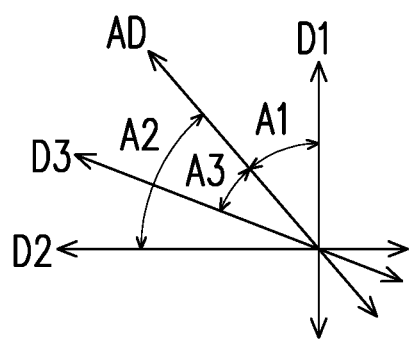

Referring to FIG. 2, in some embodiments, the top view pattern of the initial bit line contact structure BC may be a parallelogram-like shape. Such parallelogram-like shape is regarded as a convex shape from the edge of a parallelogram and has an arc-shaped contour. From another point of view, such parallelogram-like shape is similar to oval shape. In such embodiments, the initial bit line contact structure BC may have a long axis AX. The extending direction AD of the long axis AX is different from the extending direction of the word line WL (i.e., the first direction D1), the extending direction of the bit line BL (i.e., the second direction D2), and the extending direction of the active region AA (i.e., the third direction D3). In addition, the extending direction AD of the long axis AX of the initial bit line contact structure BC is close to the extending direction of the active region AA (i.e., the third direction D3), and the angle A3 between the extending direction AD of the long axis AX of the initial bit line contact structure BC and the extending direction of the active region AA (i.e., the third direction D3) is less than the angle A1 between the extending direction AD of the long axis AX of the initial bit line contact structure BC and the extending direction of the word line WL (i.e., the first direction D1) or the angle A2 between the extending direction AD of the long axis AX of the initial bit line contact structure BC and the extending direction of the bit line BL (i.e., the second direction). For example, the angle A3 may be 10° to 30°, the angle A1 may be 30° to 50°, and the angle A2 may be 40° to 60°.

As shown in FIG. 2, the portion of the active region AA between two adjacent word lines WL may be substantially a parallelogram region. The parallelogram region has a long diagonal DG1 substantially overlapping the long axis AX of the initial bit line contact structure BC and a short diagonal DG2 intersected with the long diagonal DG1. Since the long axis AX of the initial bit line contact structure BC substantially overlaps the long diagonal DG1 of the parallelogram region, the initial bit line contact structure BC may cover the two diagonal regions connected by the long diagonal DG1 of the parallelogram region of the active region AA. In addition, in some embodiments, the area of the initial bit line contact structure BC is larger than the area of the parallelogram region of the active region AA on a vertical projection plane perpendicular to the normal direction of the substrate W. In other words, the initial bit line contact structure BC may also cover the other two diagonal regions to which the short diagonal DG of the parallelogram region of the active region AA is connected. In this way, the portion of the active region AA between the two adjacent word lines WL may be completely covered by the initial bit line contact structure BC. Further, the extending direction AD of the long axis AX of the initial bit line contact structure BC is close to the extending direction of the active region AA (i.e., the third direction D3), and thus the edge of the initial bit line contact structure BC may be as close as possible to the edge of the active region AA. In this way, the initial bit line contact structure BC may be prevented from being electrically connected to the adjacent capacitive contact structure CC.

Figure 3:
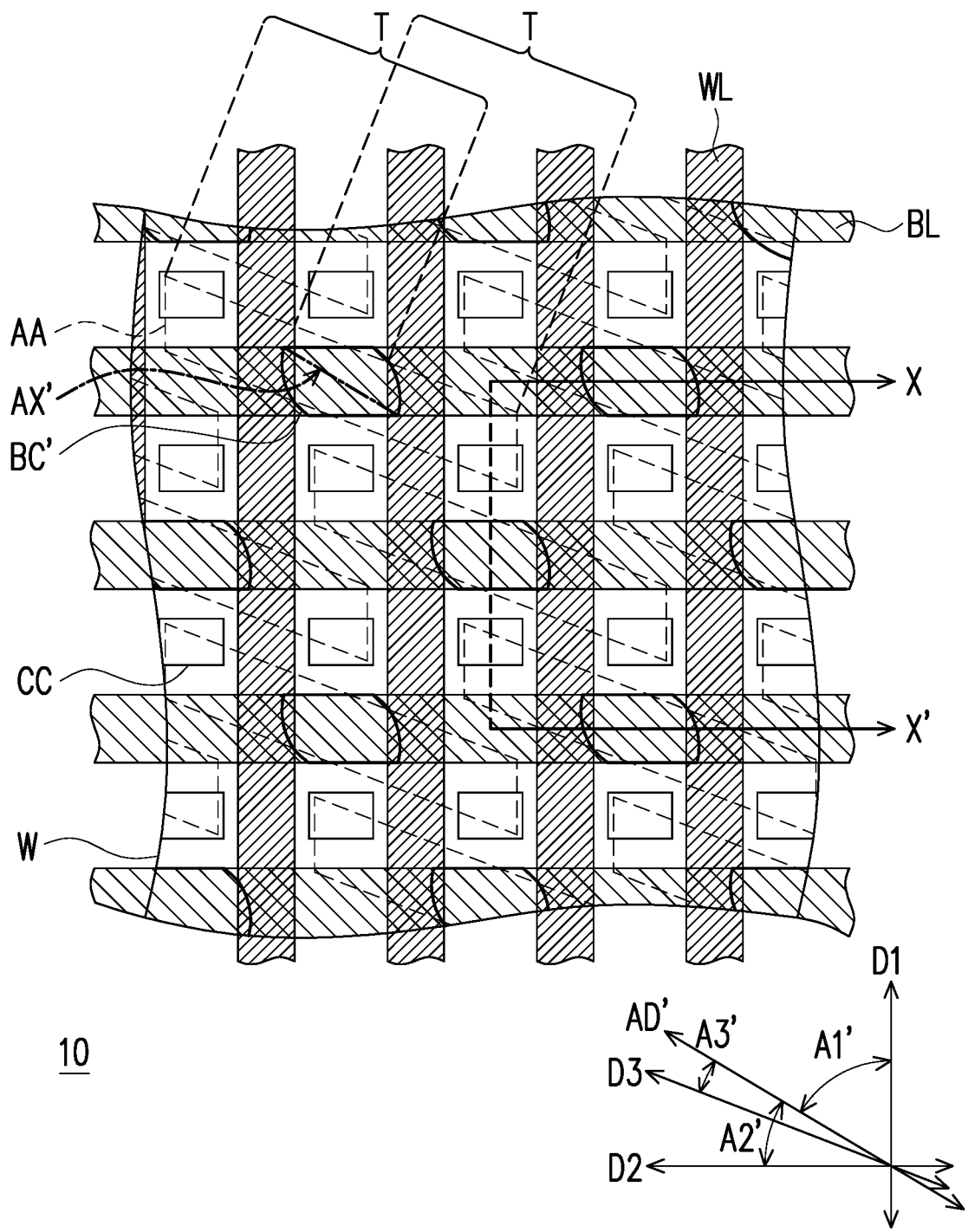
FIG. 3 is a schematic top view of a memory device in accordance with some embodiments of the present invention.

Referring to FIG. 1 and FIG. 3, portions of the initial bit line contact structures BC shown in FIG. 1 may be removed during the formation of the bit lines BL to form the bit line contact structures BC' shown in FIG. 3. In some embodiments, portions of the initial bit line contact structures BC (shown in FIG. 1) that are not overlapped with the bit lines BL are removed, such that the opposite sides of each of the formed bit line contact structures BC' (shown in FIG. 3) are substantially aligned with the contour of the corresponding bit line BL. As shown in FIG. 3, the top view pattern of the bit line contact structure BC' may be regarded as another parallelogram, and the top view pattern of the bit line contact structure BC' has a long axis AX'. The long axis AX' may be considered as the longer one of a set of diagonals of the bit line contact structure BC'. The extending direction AD' of the long axis AX' is different from the extending direction of the word line WL (i.e., the first direction D1), the extending direction of the bit line BL (i.e., the second direction D2), and the extending direction of the active region AA (i.e., the third direction D3). In addition, the extending direction AD' of the long axis AX' of the bit line contact structure BC' is close to the extending direction of the active region AA (i.e., the third direction D3), and the angle A3' between the extending direction AD' of the long axis AX' of the bit line contact structure BC' and the extending direction of the active region AA (i.e., the third direction D3) is less than the angle A1' between the extending direction AD' of the long axis AX' of the bit line contact structure BC' and the extending direction of the word line WL (i.e., the first direction DO, or the angle A2' between the extending direction AD' of the long axis AX' of the bit line contact structure BC' and the extending direction of the bit line BL (i.e., the second direction D2). For example, the angle A3' may be 10° to 30°, the angle A1' may be 40° to 60°, and the angle A2' may be 30° to 50°.

Figure 4:
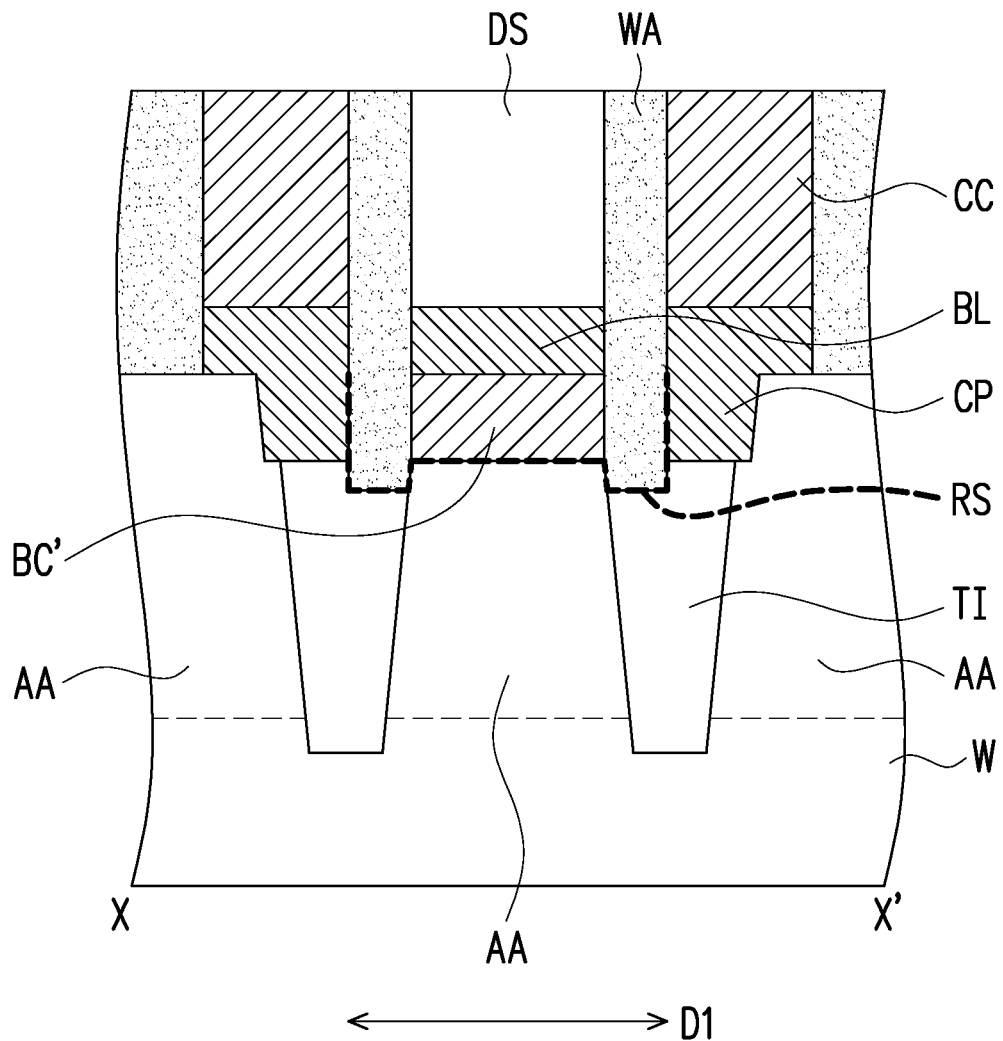
FIG. 4 is a schematic cross-sectional view taken along line X-X' of FIG. 3

Referring to FIG. 3 and FIG. 4, in some embodiments, a plurality of trench isolation structures TI are disposed in the substrate W. The trench isolation structures TI may be configured to separate the active regions AA formed in the substrate W. For example, the trench isolation structure TI may be a shallow trench isolation (STI) or a deep trench isolation (DTI). In some embodiments, the bit line contact structures BC' is disposed in the substrate W and electrically connected to the active region AA and the bit line BL. In such embodiments, the bit line contact structure BC' is located at the top of the active region AA. In some embodiments, the sidewalls on opposite sides of the bit line contact structure BC' are substantially coplanar with the sidewalls of the bit line BL and the sidewalls of the active region AA. In addition, the bit line contact structure BC' is located between two adjacent capacitive contact structures CC. In some embodiments, the capacitive contact structures CC are disposed over the substrate W, and a plurality of contact plugs CP are respectively disposed between the capacitive contact structures CC and the active regions AA in the substrate W. As shown in FIG. 4, two adjacent contact plugs CP may be located at opposite sides of the bit line contact structure BC', and overlapped with two active regions AA located at the opposite sides of the bit line contact structure BC'. In some embodiments, the contact plug CP extends down into the corresponding active region AA. Furthermore, in some embodiments, the contact plug CP may extend further to the trench isolation structure TI between it and the adjacent bit line contact structure BC'. In this way, the spacing between the contact plug CP and the bit line contact structure BC' adjacent to each other can be shortened, and the area of the memory cell of the DRAM can be reduced.

In some embodiments, each capacitive contact structure CC may be disposed between two adjacent isolation structures WA. It should be noted that, for the sake of brevity, FIGS. 1 to 3 do not show the isolation structures WA. Referring to FIG. 4, the isolation structure WA covers the sidewall of the capacitive contact structure CC. In some embodiments, the isolation structure WA extends further down between the bit line BL and the contact plug CP adjacent to each other. Furthermore, in some embodiments, the isolation structure WA may extend further to the trench isolation structure TI, such that the isolation structure WA is located between the bit line contact structure BC' and the contact plug CP adjacent to each other. In such embodiments, the bottom surface of the isolation structure WA may be lower than the bottom surface of the bit line contact structure BC' and the bottom surface of the contact plug CP, and higher than the bottom surface of the trench isolation structure TI.

The bit line BL is located between two adjacent capacitive contact structures CC (or between two adjacent contact plugs CP), and the two adjacent capacitive contact structures CC (or the two adjacent contact plugs CP) may be respectively isolated from the bit line BL by the isolation structures WA. In some embodiments, the top surface of the bit line BL is lower than the top surface of the isolation structure WA and the top surface of the capacitive contact structure CC. In such embodiments, a dielectric structure DS may be disposed above the bit line BL. The dielectric structure DS is located between two adjacent isolation structures WA, and covers the top surface of the bit line BL. In some embodiments, the top surface of the dielectric structure DS is substantially coplanar with the top surface of the isolation structure WA and the top surface of the capacitive contact structure CC.

In some embodiments, the substrate W may be a semiconductor substrate or a semiconductor on insulator (SOI) substrate. The semiconductor material in the semiconductor substrate or the SOI substrate may include an elemental semiconductor, an alloy semiconductor, or a compound semiconductor. For example, the elemental semiconductor may include Si or Ge, the alloy semiconductors may include SiGe, SiC, SiGeC, or the like, and the compound semiconductor may include a III-V semiconductor material or a II-VI semiconductor material. In some embodiments, the substrate W may be doped to be a first conductivity type or a second conductivity type complementary to the first conductivity type. For example, the first conductivity type may be an N type, and the second conductivity type may be a P type. In some embodiments, the material of the trench isolation structure TI located in the substrate W is an insulating material. For example, the material of the trench isolation structure TI may include silicon oxide, silicon nitride, silicon oxynitride, the like, or a combination thereof. In addition, the materials of the word line WL (referring to FIG. 1), the bit line contact structure BC' and the contact plug CP at least partially disposed in the substrate W may respectively be a conductor material. In some embodiments, the material of the word line WL, the material of the bit line contact structure BC' and the material of the contact plug CP may respectively include doped or undoped polysilicon, metal material (such as, tungsten), or the like. In addition, the materials of the bit line BL and the capacitive contact structure CC on the substrate W may respectively be a conductor material, for example, including doped or undoped polysilicon, titanium nitride, tungsten, the like, or a combination thereof. In addition, the dielectric structure DS on the substrate W is made of an insulating material, for example, including silicon oxide, silicon nitride, silicon oxynitride, the like, or a combination thereof. In some embodiments, the isolation structure WA may be a single structure, and the material of the single structure may include silicon oxide or other low dielectric constant dielectric (such as, a dielectric material with a dielectric constant lower than 4). In an alternative embodiment, the isolation structure WA may be a multilayer structure, such as a of silicon oxide-silicon nitride-silicon oxide (ONO). Moreover, in other embodiments, the isolation structure WA has an air gap.

In some embodiments, although not shown, a metal silicide layer may be located between the contact plug CP and the capacitive contact structure CC and/or between the bit line contact structure BC' and the bit line BL. For example, the material of the metal silicide layer may include Co-silicide, Ti-silicide, W-silicide, Ta-silicide, Mo-silicide, the like or a combination thereof. By providing such metal silicide layer, the contact resistance between the contact plug CP and the capacitive contact structure CC and/or between the bit line contact structure BC' and the bit line BL can be reduced.

In some embodiments, the manufacturing method of the initial bit line contact structure BC shown in FIG. 1 includes a lithography process, an etching process, and a deposition process. By performing the lithography process and the etching process, a recess RS (as shown by the dotted line in FIG. 4) for accommodating the initial bit line contact structure BC may be defined on the surface of the substrate W. The recess RS is located at the top of the active region AA and may extend laterally to the adjacent trench isolation structures TI (filled by the isolation structures WA in a subsequent process, as shown in FIG. 4). Subsequently, the deposition process (for example, a chemical vapor deposition process) may be performed to fill the recess RS with a conductor material to form the initial bit line contact structure BC. In some embodiments, the conductor material may initially extend over a portion of the substrate W that is outside the recess RS, and then a portion of the conductor material located outside the recess RS of the substrate W may be removed by a planarization process (e.g., a chemical mechanical polishing process and/or an etching process) to finally form the initial bit line contact structure BC.

Figure 5:
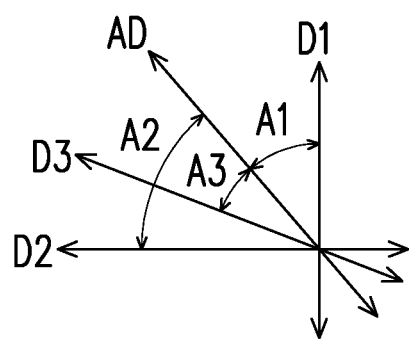
FIG. 5 is a schematic top view of a free-form lens array and a photomask pattern used to form the initial bit line contact structure shown in FIG. 1 and FIG. 2.
Figure 5:
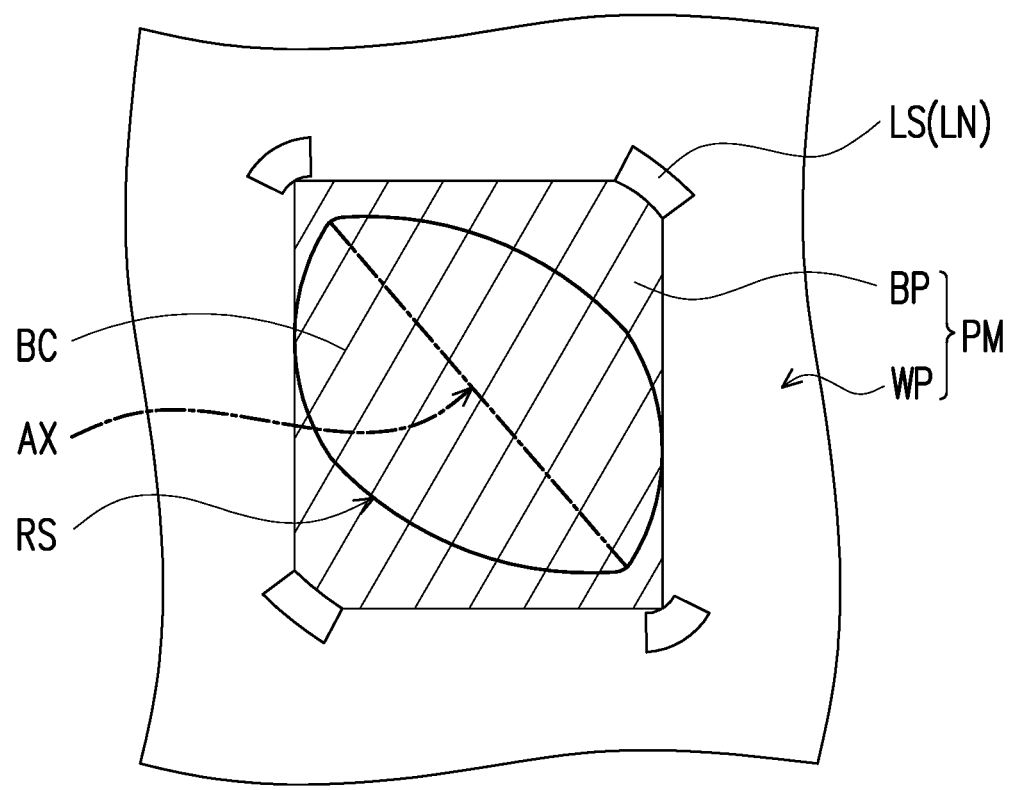

Referring to FIG. 1, FIG. 4 and FIG. 5, in the lithography process for forming the initial bit line contact structure BC, the light emitted by the light source may first pass through a free-form lens array LN and then a photomask PM to expose a photoresist pattern (not shown) formed on the substrate W. After a developing operation is performed on the photoresist pattern, an opening defining a contour of the recess RS may be formed in the photoresist pattern. Then, the substrate W (or the substrate W and the trench isolation structures TI) may be etched by using the patterned photoresist pattern as a mask to form the recess RS (shown in FIG. 4). Subsequently, the initial bit line contact structure BC may be formed in the recess RS by a deposition process. In some embodiments, the photoresist pattern is a negative-type photoresist. In such embodiments, the physical portion BP of the photomask PM overlaps the initial bit line contact structure BC, and the opening portion WP of the photomask PM surrounds the physical portion BP. Alternatively, the photoresist pattern may be a positive-type photoresist, and the initial bit line contact structure BC is exposed by the opening portion WP of the photomask PM, that is, the physical portion BP of the photomask PM surrounds the opening portion WP. In some embodiments, the free-form lens array LN includes a plurality of lenses LS. For example, as shown in FIG. 5, the free-form lens array LN includes four lenses LS. In an embodiment using a negative-type photoresist, the lenses LS may be disposed at the corners of the physical portion BP of the photomask PM. For example, the shape of the physical portion BP of the photomask PM is a rectangular shape, and the four lenses LS are disposed at four corners of the physical portion BP. As a result, the four lenses LS are arranged along a contour similar to a parallelogram-like shape, and one diagonal of such parallelogram-like shape is substantially overlapped with the long axis AX of the initial bit line contact structure BC. A pair of lenses LS in the lenses LS may be disposed in the extending direction AD of the long axis AX of the initial bit line contact structure BC. Further, in an alternative embodiment using a positive-type photoresist, the lenses LS may be disposed at the corners of the opening portion WP of the photomask PM. In such alternative embodiments, the lenses LS may still be configured in the manner illustrated in FIG. 5, except that the positions of the physical portion BP and the opening portion WP of the photomask PM are opposite to each other. Furthermore, in some embodiments, at least two of the lenses LS may have different shapes and/or areas. For example, as shown in FIG. 5, the area of each of the two lenses LS arranged along the extending direction AD of the long axis AX may be less than the area of each of the other two lenses LS, and the shape of each of the two lenses LS arranged along the extending direction AD of the long axis AX may be slightly different form the shape of each of the other two lenses LS. However, the present invention is not limited thereto. Those skilled in the art can adjust the shape and the size of each lens LS according to the shape of the initial bit line contact structure BC to be defined.

As can be seen from the above, by adjusting the configuration of the free-form lens array LN, the path of the incident light passing through the photomask PM may be changed, and then the shape of the formed recess RS or the formed initial bit line contact structure BC may be different from the shape of the physical portion BP of the photomask PM. In other words, the shape of the physical portion BP of the photomask PM does not need to be identical to the shape of the recess RS or the shape of the initial bit line contact structure BC. That is, the contour of the initial bit line contact structure BC may be finely adjusted by the configuration of the free-form lens array LN without specifically changing the pattern of the photomask PM.

Figure 6:
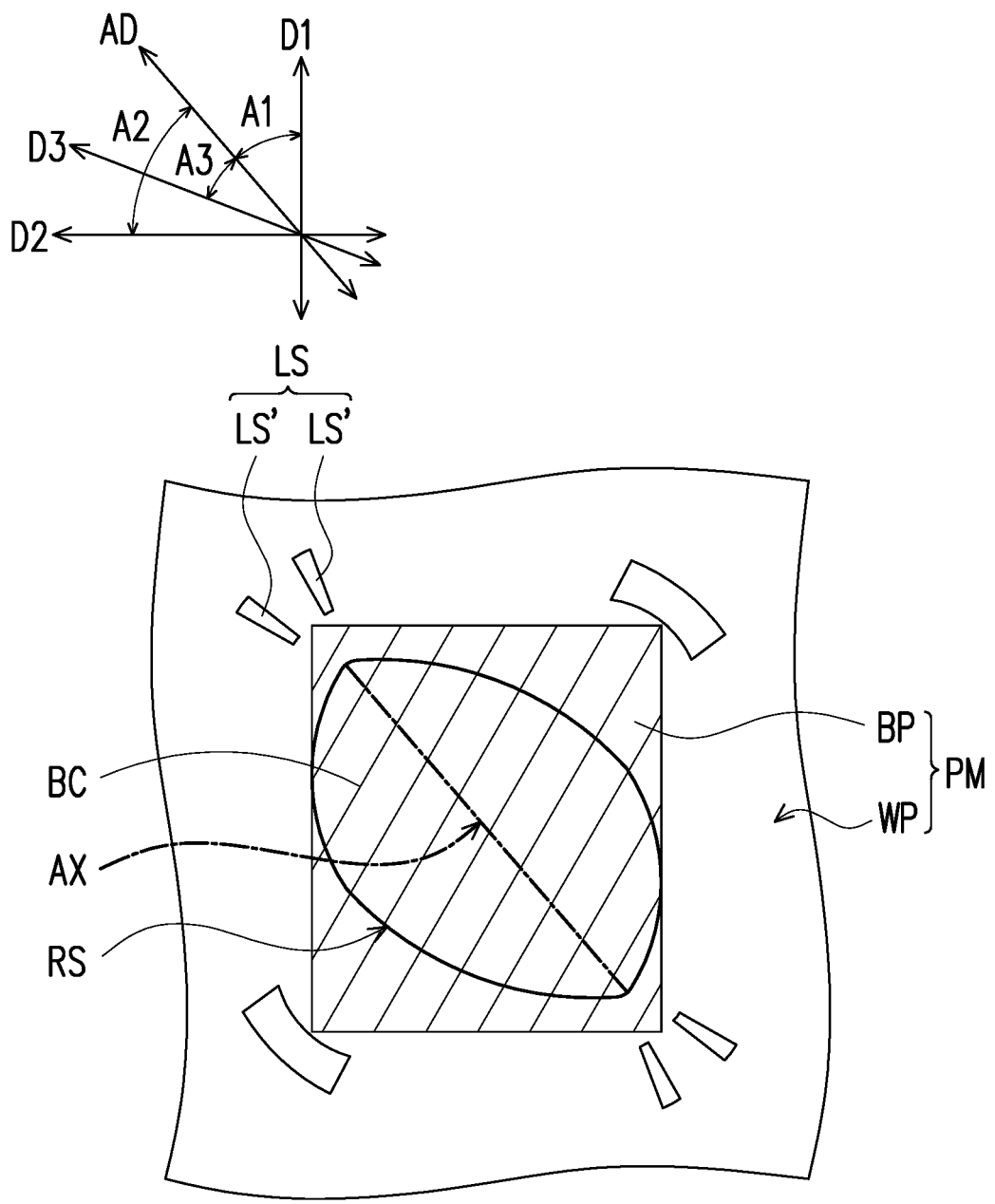
FIG. 6 is a schematic top view of a free-form lens array and a photomask pattern of other embodiments.

Referring to FIG. 6, in other embodiments, a pair of lenses LS in the lenses LS each include a plurality of sub-lenses LS'. For example, a pair of lenses LS arranged along the extending direction AD of the long axis AX respectively include two sub-lenses LS'. The two sub-lens LS' may be arranged in a mirrored configuration with respect to the long axis AX of the initial bit line contact structure BC. However, the present invention is not limited thereto. Those skilled in the art can set other lenses LS than the lenses LS arranged along the extending direction AD of the long axis AX mentioned above to have a plurality of sub-lenses separated from each other according to design requirements.

In summary, the memory device 10 of the embodiment of the present invention includes the word line WL, the bit line BL, the active region AA, the bit line contact structure BC' and the capacitive contact structure CC, and is used as a DRAM device. The active region AA defines the position of one or more transistors T. The gate of the transistor T is electrically connected to the word line WL, and the drain and the source of the transistor T are electrically connected to the bit line contact structure BC' and the capacitive contact structure CC. The bit line contact structure BC' is configured to electrically connect the active region AA to the bit line BL, and the capacitive contact structure CC is configured to electrically connect the active region AA to the storage capacitor (not shown). The word line WL extends along the first direction D1, and the bit line BL extends along the second direction D2 intersected with the first direction D1. Moreover, the active region AA extends along the third direction D3 different from the first direction D1 and the second direction D2.

The shape of the portion of the active region AA between two adjacent word lines WL may be a parallelogram. In addition, the initial structure of the bit line contact structure BC' (i.e., the initial bit line contact structure BC shown in FIG. 1 and FIG. 2) overlying some of the parallelogram portion of the active region AA has a parallelogram-like shape or an oval-like shape, and the long axis AX of the initial structure (i.e., the initial bit line contact structure BC) may be substantially overlapped with the long diagonal DG1 of such parallelogram portion of the active region AA. That is, because the contour of the initial structure of the bit line contact structure BC' (i.e., the initial bit line contact structure BC) is as close as possible to the edge of the parallelogram portion of the active region AA, the initial structure of the bit line contact structure BC' (i.e., the initial bit line contact structure BC) completely cover the parallelogram portion of the active region AA. In other words, when forming the initial structure of the bit line contact structure BC' (i.e., the initial bit line contact structure BC), the top of the active region AA is completely removed, and thereby it is possible to avoid some portions of the active region AA remaining around the bit line contact structure BC' which is subsequently formed. A parasitic capacitance may be formed between such residual portions of the active region AA and the bit line BL, and such residual portions of the active region AA may cause a short circuit problem with the adjacent capacitive contact structure CC. Therefore, the bit line contact structure BC' formed by the manufacturing method of the present invention can avoid the above-mentioned problems of parasitic capacitance and short circuit, and the reliability of the memory device 10 can be improved.

Although the present invention has been disclosed in the above embodiments, it is not intended to limit the invention, and those skilled in the art can make some modifications and refinements without departing from the spirit and scope of the invention. Therefore, the scope of protection of the present invention is subject to the definition of the scope of the appended patent application.

What is claimed is:

1. A memory device, comprising:
   a word line disposed in a substrate and extending along a first direction;
   a bit line disposed over the substrate and extending along a second direction, wherein the first direction is intersected with the second direction;
   an active region disposed in the substrate, extending along a third direction and intersected with the word line and the bit line, wherein the third direction is different from the first direction and the second direction;
   a bit line contact structure disposed between the active region and the bit line, wherein a top view pattern of the bit line contact structure has a long axis, and wherein an angle between an extending direction of the long axis and the third direction is less than an angle between the extending direction of the long axis and the first direction, and is less than an angle between the extending direction of the long axis and the second direction;
   a plurality of capacitive contact structures respectively disposed between two adjacent isolation structures of a plurality of isolation structures, wherein the bit line is located between two adjacent capacitive contact structures of the plurality of capacitive contact structures, the two adjacent capacitive contact structures are respectively isolated from the bit line by the plurality of isolation structures.

2. The memory device of claim 1, wherein sidewalls of opposite sides of the bit line contact structure are substantially coplanar with respect to sidewalls of opposite sides of the bit line.

3. The memory device of claim 1, wherein the top view pattern of the bit line contact structure is a parallelogram-like shape.

4. The memory device of claim 3, wherein a portion of the parallelogram-like shape has an arc-shaped contour.

5. The memory device of claim 1, wherein the capacitive contact structure is electrically connected to the active region, wherein the word line is located between the capacitive contact structure and the bit line contact structure.

6. The memory device of claim 1, wherein one of the isolation structures extends down between the bit line and a contact plug adjacent to each other, and extends further to a trench isolation structure.

7. The memory device of claim 6, wherein a bottom surface of the one of the isolation structures is lower than a bottom surface of the bit line contact structure and a bottom surface of the contact plug, and higher than a bottom surface of the trench isolation structure.

8. The memory device of claim 1, wherein one of the isolation structures is a single structure, and a material of the one of the isolation structures comprises silicon oxide or other low dielectric constant dielectric.

9. The memory device of claim 1, wherein one of the isolation structures is a multilayer structure comprising silicon oxide-silicon nitride-silicon oxide.

10. The memory device of claim 1, wherein one of the isolation structures has an air gap.

11. The memory device of claim 1, wherein a top surface of the bit line is lower than a top surface of one of the isolation structures and a top surface of the capacitive contact structure.

12. The memory device of claim 1, further comprising a dielectric structure disposed above the bit line, and covering a top surface of the bit line.

13. The memory device of claim 12, wherein a top surface of the dielectric structure is substantially coplanar with a top surface of one of the isolation structures and a top surface of the capacitive contact structure.

14. The memory device of claim 1, wherein sidewalls on opposite sides of the bit line contact structure are substantially coplanar with sidewalls of the active region.

15. The memory device of claim 1, wherein the bit line contact structure is disposed in the substrate.

16. The memory device of claim 1, further comprising a contact plug disposed between corresponding capacitive contact structure of the capacitive contact structures and the active region in the substrate.

17. The memory device of claim 16, wherein the contact plug extends down into the active region, and extends further to a trench isolation structure between the contact plug and the bit line contact structure.

18. The memory device of claim 16, further comprising a metal silicide layer located between the contact plug and the capacitive contact structure or between the bit line contact structure and the bit line.

* * * * *